US007658772B2

(12) United States Patent
Tavkhelidze et al.

(10) Patent No.: US 7,658,772 B2
(45) **Date of Patent: *Feb. 9, 2010**

(54) PROCESS FOR MAKING ELECTRODE PAIRS

(75) Inventors: Avto Tavkhelidze, Tbilisi (GE); Stuart Harbron, Berkhamsted (GB)

(73) Assignee: Borealis Technical Limited (GI)

( * ) Notice: Subject to any disclaimer, the term of this patent is extended or adjusted under 35 U.S.C. 154(b) by 425 days.

This patent is subject to a terminal disclaimer.

(21) Appl. No.: 11/254,495

(22) Filed: Oct. 20, 2005

(65) Prior Publication Data

US 2006/0038290 A1 Feb. 23, 2006

Related U.S. Application Data

(63) Continuation-in-part of application No. 10/234,498, filed on Sep. 3, 2002, now Pat. No. 7,140,102, application No. 11/254,495, filed on Oct. 20, 2005, which is a continuation-in-part of application No. 10/507,273, filed as application No. PCT/US03/07015 on Mar. 6, 2003, now Pat. No. 7,169,006, which is a continuation-in-part of application No. 10/823,483, filed on Apr. 12, 2004, now abandoned, which is a continuation-in-part of application No. 09/481,803, filed on Aug. 31, 1998, now Pat. No. 6,720,704, which is a continuation-in-part of application No. 08/924,910, filed on Sep. 8, 1997, now abandoned.

(60) Provisional application No. 60/316,918, filed on Sep. 2, 2001, provisional application No. 60/362,494, filed on Mar. 6, 2002, provisional application No. 60/373,508, filed on Apr. 17, 2002.

(30) Foreign Application Priority Data

Oct. 25, 2004 (GB) ................................ 0423534.7

(51) Int. Cl.
*H01L 21/00* (2006.01)
*H05K 3/30* (2006.01)

(52) U.S. Cl. .......................... 29/25.02; 29/831; 29/842; 29/847; 427/250; 427/455

(58) Field of Classification Search ................ 29/25.02, 29/831, 842, 847; 427/250; 438/455
See application file for complete search history.

(56) References Cited

U.S. PATENT DOCUMENTS 2,510,397 A 6/1950 Hansell (Continued)

FOREIGN PATENT DOCUMENTS

DE 3404137 A1 8/1985

(Continued)

OTHER PUBLICATIONS

Chou et al., "Imprint Lithography with 25 Nanometer Resolution", Science, Apr. 5, 1996, pp. 85-87, vol. 272.

(Continued)

*Primary Examiner*—C. J Arbes

(57) ABSTRACT

The present invention is a process for making a matching pair of surfaces, which involves creating a network of channels on one surface of two substrate. The substrates are then coated with one or more layers of materials, the coating extending over the regions between the channels and also partially into the channels. The two coated surfaces are then contacted and pressure is applied, which causes the coatings to be pressed into the network of channels, and surface features on one of the layers of material creates matching surface features in the other, and vice versa. It also results in the formation of a composite. In a final step, the composite is separated, forming a matching pair of surfaces.

17 Claims, 2 Drawing Sheets

U.S. PATENT DOCUMENTS

| | | | | |
|---|---|---|---|---|
| 2,915,652 | A | 12/1959 | Hatsopoulos | |
| 3,021,472 | A | 2/1962 | Hernqvist | |
| 3,118,107 | A | 1/1964 | Gabor | |
| 3,169,200 | A | 2/1965 | Huffman | |
| 3,173,032 | A | 3/1965 | Maynard | |
| 3,194,989 | A | 7/1965 | Garbuny | |
| 3,238,395 | A | 3/1966 | Sense | |
| 3,239,745 | A | 3/1966 | Hernqvist | |
| 3,267,307 | A | 8/1966 | Fox | |
| 3,267,308 | A | 8/1966 | Hernqvist | |
| 3,300,660 | A | 1/1967 | Bensimon | |
| 3,328,611 | A | 6/1967 | Davis | |
| 3,376,437 | A | 4/1968 | Meyerand, Jr. | |
| 3,393,330 | A | 7/1968 | Vary | |
| 3,470,393 | A | 9/1969 | Moncorge | |
| 3,515,908 | A | 6/1970 | Caldwell | |
| 3,519,854 | A | 7/1970 | Davis | |
| 3,578,992 | A | 5/1971 | Shimada | |
| 3,740,592 | A | 6/1973 | Engdahl et al. | |
| 3,821,462 | A | 6/1974 | Kaufman et al. | |
| 3,843,896 | A | 10/1974 | Rason et al. | |
| 4,004,210 | A | 1/1977 | Yater | |
| 4,011,582 | A | 3/1977 | Cline et al. | |
| 4,039,352 | A | 8/1977 | Marinescu | |
| 4,063,965 | A | 12/1977 | Cline et al. | |
| 4,224,461 | A | 9/1980 | Snyder, Jr. et al. | |
| 4,281,280 | A | 7/1981 | Richards | |
| 4,410,951 | A | 10/1983 | Nakamura | |
| 4,423,347 | A | 12/1983 | Kleinschmidt | |
| 4,667,126 | A | 5/1987 | Fitzpatrick | |
| 4,686,162 | A | 8/1987 | Stangl et al. | |
| 4,937,489 | A | 6/1990 | Hattori | |
| 4,958,201 | A | 9/1990 | Mimura | |
| 5,023,671 | A | 6/1991 | DiVincenzo et al. | |
| 5,028,835 | A | 7/1991 | Fitzpatrick | |
| 5,049,775 | A | 9/1991 | Smits | |
| 5,068,535 | A | 11/1991 | Rabalais | |
| 5,083,056 | A | 1/1992 | Kondou | |
| 5,119,151 | A | 6/1992 | Onda | |
| 5,229,320 | A | 7/1993 | Ugajin | |
| 5,233,205 | A | 8/1993 | Usagawa | |
| 5,247,223 | A | 9/1993 | Mori | |
| 5,307,311 | A | 4/1994 | Sliwa, Jr. | |
| 5,332,952 | A | 7/1994 | Ugajin | |
| 5,336,547 | A | 8/1994 | Kawakita et al. | |
| 5,351,412 | A | 10/1994 | Furuhata | |
| 5,356,484 | A | 10/1994 | Yater | |
| 5,371,388 | A | 12/1994 | Oda | |
| 5,410,166 | A | 4/1995 | Kennel | |
| 5,432,362 | A | 7/1995 | Lippens et al. | |
| 5,465,021 | A | 11/1995 | Visscher | |
| 5,487,790 | A | 1/1996 | Yasuda | |
| 5,503,963 | A | 4/1996 | Bifano | |
| 5,521,735 | A | 5/1996 | Shimizu et al. | |
| 5,579,232 | A | 11/1996 | Tong et al. | |
| 5,592,042 | A | 1/1997 | Takuchi | |
| 5,604,357 | A | 2/1997 | Hori | |
| 5,654,557 | A | 8/1997 | Taneya et al. | |
| 5,675,972 | A | 10/1997 | Edelson | |
| 5,699,668 | A | 12/1997 | Cox | |
| 5,701,043 | A | 12/1997 | Razzaghi | |
| 5,705,321 | A | 1/1998 | Brueck et al. | |
| 5,719,407 | A | 2/1998 | Ugajin | |
| 5,722,242 | A | 3/1998 | Edelson | |
| 5,772,905 | A | 6/1998 | Chou | |
| 5,810,980 | A | 9/1998 | Edelson | |
| 5,874,039 | A | 2/1999 | Edelson | |
| 5,917,156 | A | 6/1999 | Nobori et al. | |
| 5,973,259 | A | 10/1999 | Edelson | |
| 5,981,071 | A | 11/1999 | Cox | |
| 5,981,866 | A | 11/1999 | Edelson | |
| 5,994,638 | A | 11/1999 | Edelson | |
| 6,064,137 | A | 5/2000 | Cox | |
| 6,084,173 | A | 7/2000 | DiMatteo | |
| 6,089,311 | A | 7/2000 | Edelson | |
| 6,117,344 | A | 9/2000 | Cox et al. | |
| 6,214,651 | B1 | 4/2001 | Cox | |
| 6,225,205 | B1 | 5/2001 | Kinoshita | |
| 6,281,514 | B1 | 8/2001 | Tavkhelidze | |
| 6,309,580 | B1 | 10/2001 | Chou | |
| 6,417,060 | B2 | 7/2002 | Tavkhelidze et al. | |
| 6,495,843 | B1 | 12/2002 | Tavkelidze et al. | |
| 6,531,703 | B1 | 3/2003 | Tavkhelidze et al. | |
| 6,680,214 | B1 | 1/2004 | Tavkhelidze et al. | |
| 6,720,704 | B1 | 4/2004 | Tavkhelidze et al. | |
| 6,957,608 | B1 * | 10/2005 | Hubert et al. | 101/483 |
| 6,964,793 | B2 * | 11/2005 | Willson et al. | 427/466 |
| 6,971,165 | B1 * | 12/2005 | Tavkhelidze | 29/842 |
| 7,100,263 | B2 * | 9/2006 | Imada et al. | 29/514 |
| 7,140,102 | B2 * | 11/2006 | Taliashvili et al. | 29/842 |
| 7,150,844 | B2 * | 12/2006 | Deeman et al. | 264/220 |
| 7,169,006 | B2 * | 1/2007 | Tavkhelidze et al. | 445/67 |
| 7,291,554 | B2 * | 11/2007 | Nakagawa et al. | 438/637 |
| 7,294,571 | B2 * | 11/2007 | Nakagawa et al. | 438/672 |
| 2001/0046749 | A1 | 11/2001 | Tavkhelidze et al. | |
| 2003/0068431 | A1 | 4/2003 | Taliashvili et al. | |
| 2003/0221608 | A1 | 12/2003 | Mori | |
| 2004/0174596 | A1 | 9/2004 | Umeki | |
| 2004/0195934 | A1 | 10/2004 | Tanielian | |

FOREIGN PATENT DOCUMENTS

| | | | |
|---|---|---|---|
| DE | 3818192 | A1 | 12/1989 |
| EP | 0437654 | A1 | 7/1991 |
| JP | 03155376 | A | 7/1991 |
| JP | 404080964 | A | 3/1992 |
| JP | 05226704 | A | 9/1993 |
| SU | 861916 | A | 9/1981 |
| WO | WO 97/02460 | A1 | 1/1997 |
| WO | WO 99/13562 | A1 | 3/1999 |
| WO | WO-99/64642 | A | 12/1999 |
| WO | WO-00/59047 | A | 10/2000 |
| WO | WO-02/47178 | A | 6/2002 |
| WO | WO 03/090245 | A1 | 10/2003 |
| WO | WO-2003/083177 | A3 | 10/2003 |

OTHER PUBLICATIONS

Sungtaek Ju et al., "Study of interface effects in thermoelectric microfefrigerators", Journal of Applied Physics, Oct. 1, 2000, pp. 4135-4139, vol. 88, No. 7.

Hishinuma et al., "Refrigeration by combined tunneling and thermionic emmission in vacuum: Use of nanometer scale design", Appl Phys Lett, Apr. 23, 2001, pp. 2572-2574,vol. 78,No. 17.

Leon N. Cooper, "Bound Electron Pairs in Degenerate Fermi Gas", Physical Review, Nov. 15, 1956, pp. 1189-1190, vol. 104, No. 4.

Bardeen et al., "Theory of Superconductivity", Physical Review, Dec. 1, 1957, pp. 1175-1204, vol. 108, No. 5.

Fitzpatrick, G.O. et al.. "Close-Spaced Thermionic Converters with Active Spacing Control and Heat Pipe Isothermal Emitters." IEEE.vol. 2: pp. 920-927 (1996).

Fitzpatrick, G.O. et al. "Demonstration of Close-Spaced Thermionic Converters." Abs. Papers. Am. Chem. Soc. 93355: pp. 1.573-1.580 (1993).

Mahan, G.D. "Thermionic Refrigeration." J. Appl. Phys 76: pp. 4362-4366 (1994).

Huffman, F.N. et al. "Preliminary Investigation of a Thermotunnel Converter." 23rd Intersociety Energy Conversion Engineering Conference vol. 1: pp. 573-579 (1988).

Houston. J.M. "Theoretical Efficiency of the Thermionic Energy Converter." J.Appl. Phys. 30: pp. 481-487 (1959).
King. D.B. et al.. "Results from the Microminiature Thermionic Converter Demonstration Testing Program." Am. Inst. Of Phys. 1-56396-846: pp. 1432-1436 (1999).
Zeng. T and Chen. G. "Hot Electron Effects on Thermionic Emission Cooling in Heterostructures." Mat. Res. Soc. 545: pp. 467-472 (1999).
Shakouri. A. et al. "Enhanced Thermionic Emission Cooling in High Barrier Superlattice Hetero- structures." Mat. Res. Soc. 545: pp. 449-458 (1999).
Fukuda. R. et al. "Development of the Oxygenated Thermionic Energy Converters Utilizing the Sputtered Metal Oxides as a Collector." Am. Inst. Phys. pp. 1444-1451 (1999).
Svensson, R. and Holmid. L. "TEC as Electric Generator in an Automobile Catalytic Converter." IEEE. vol. 2: pp. 941-944 (1996).
Fitzpartrick, G.O. et al.: "Updated perspective on the potential for thermionic conversion to meet 21st century energy needs" IECEC '97, Proceedings of the 32nd Intersociety Energy Conversion Engineering Conference. Energy Systems, Renewable Energy Resources, Environmental Impact and Policy Impacts on Energy. Honolulu, HI Jul. 27-Aug. 1, 1997, Intersociety Energy Convers. vol. 3&4, Jul. 27, 1997. pp. 1045-1051.
Kalandarishvili, A.G.: "The basics of the technology of creating a small interelectrode spacing in thermionic energy converters with the use of two-phase systems" IECEC '97, Proceedings of the 32nd Intersociety Energy Conversion Engineering Conference. Energy Systems, Renewable Energy Resources, Environmental Impact and Policy Impacts on Energy. Honolulu, HI Jul. 27-Aug. 1, 1997, Intersociety Energy Convers. vol. 3&4, Jul. 27, 1997. pp. 1052-1056.

* cited by examiner

PROCESS FOR MAKING ELECTRODE PAIRS

CROSS-REFERENCE TO RELATED APPLICATIONS

This application claims the benefit of U.K. Provisional Application No. GB0423534.7, filed Oct. 25, 2004. This application is a continuation-in-part of U.S. patent application Ser. No. 10/234,498, filed 3 Sep. 2002, now U.S. Pat. No. 7,140,102 which claims the benefit of U.S. Provisional Application No. 60/316,918, filed 2 Sep. 2001. This application is a Continuation-in-Part of U.S. patent application Ser. No. 10/507,273, now U.S. Pat. No. 7,169,006 which is the U.S. national stage application of International Application PCT/US03/07015, filed Mar. 6, 2003, which international application was published on Oct. 30, 2003, as International Publication WO03090245 in the English language. The International Application claims the benefit of U.S. Provisional Application No. 60/362,494, filed Mar. 6, 2002, and U.S. Provisional Application No. 60/373,508, filed Apr. 17, 2002. This application is a Continuation-in-Part of U.S. patent application Ser. No. 10/823,483, filed 12 Apr. 2004, now abandoned which is a Continuation-in-Part of U.S. patent application Ser. No. 09/481,803, filed 31 Aug. 1998, U.S. Pat. No. 6,720,704, which is a Continuation-in-Part of U.S. patent application Ser. No. 08/924,910, filed 8 Sep. 1997, abandoned. The above-mentioned patent applications are assigned to the assignee of the present application and are herein incorporated in their entirety by reference.

BACKGROUND OF THE INVENTION

This invention relates to a method for making electrode pairs.

The use of individual actuating devices to control the separation of electrodes in a gap diode is disclosed in U.S. Pat. No. 6,720,704.

The use of composite materials as matching electrode pair precursors is disclosed in US2003/0068431. The approach comprises the steps of fabricating a first electrode with a substantially flat surface; placing over the first electrode a second material that comprises a material that is suitable for use as a second electrode, and separating the composite so formed along the boundary of the two layers into two matched electrodes. The separation step involves the use of an electrical current, thermal stresses, or mechanical force. A similar approach is also disclosed in US2004/0195934.

BRIEF SUMMARY OF THE INVENTION

From the foregoing, it may be appreciated that a need has arisen for a simpler, more direct approach for manufacturing matched pairs of surfaces.

The present invention is a process for making a matching pair of surfaces, which involves creating a network of channels on one surface of two substrate. The substrates are then coated with one or more layers of materials, the coating extending over the regions between the channels and also partially into the channels. The two coated surfaces are then contacted and pressure is applied, which causes the coatings to be pressed into the network of channels, and surface features on one of the layers of material creates matching surface features in the other, and vice versa. It also results in the formation of a composite. In a final step, the composite is separated, forming a matching pair of surfaces.

BRIEF DESCRIPTION OF THE SEVERAL VIEWS OF THE DRAWING

For a more complete explanation of the present invention and the technical advantages thereof, reference is now made to the following description and the accompanying drawing in which.

DETAILED DESCRIPTION OF THE INVENTION

In the disclosure which follows, when surface features of two facing surfaces of electrodes are described as "matching" it means that where one surface has an indentation, the other surface has a protrusion and vice versa. Thus when "matched" the two surfaces are substantially equidistant from each other throughout their operating range.

Figure 1:
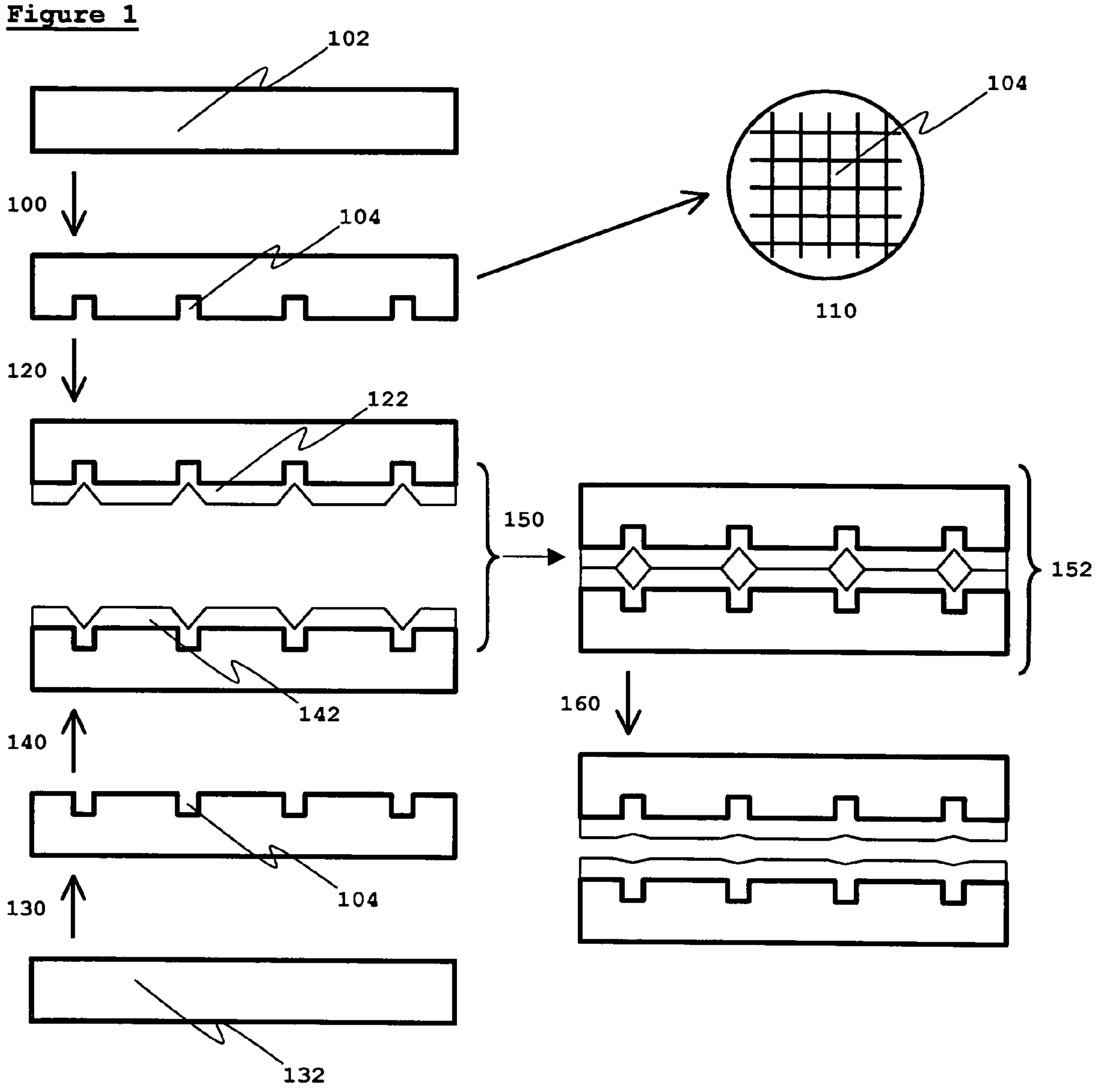
FIG. 1 shows a diagrammatic overview of the process of the present invention.

Embodiments of the present invention and their technical advantages may be better understood by referring to FIG. 1, in which a first substrate 102 is provided. Preferably the substrate comprises silicon, though other materials commonly used, such as without limitation glass, silica or molybdenum may be utilized.

In a first step 100, a network of channels 104 is created in the surface of the substrate. The channels may be formed by any conventional method, including but not limited to photolithography and ion beam milling. Typically the channels have a depth of 100 nm, and the spacing between the channels is typically 500 μm. Other depths and spacings may be conveniently employed, the key feature of this part of the invention is that the channels are of sufficient depth and spacing to accommodate material pushed laterally in step 150 below. In a preferred embodiment the channels are arranged in a grid-like formation as shown in the plan view 110. However, other arrangements are possible; the key feature of this part of the invention is that the channels are interconnected into a network of channels.

In a second step 120, a first material 122 is deposited on a surface of the substrate. The first material comprises material that is suitable for use as an electrode. Preferably, the first material comprises silver. Other materials include gold, platinum, palladium, tungsten or chromium. Whilst step 120 is shown as a single step, it may comprise multiple steps. For example, in a preferred embodiment, a layer of silver is first deposited. Then, the surface of the layer of silver is oxidized to form a layer of silver oxide. Subsequently the layer of silver oxide is caesiated to form a layer of AgCsO on the surface of the first material. The scope of the invention is not limited to the use of these materials, and the use of other materials commonly employed in wafer applications are encompassed within the present invention.

In a third step 130, a second substrate 132 is provided, and in a step analogous to step 100, a network of channels is created in the surface of the substrate. Preferably the channels have a depth of 100 nm, and the spacing between the channels is typically 500 μm. Other depths and spacings may be conveniently employed, the key feature of this part of the invention is that the channels are of sufficient depth and spacing to accommodate material pushed laterally in step 150 below. In a preferred embodiment the channels are arranged in a grid-like formation as shown in the plan view 110. However, other arrangements are possible; the key feature of this part of the invention is that the channels are interconnected into a network of channels.

In a fourth step 140, a second material 142 is deposited on a surface of the substrate. The second material comprises material that is suitable for use as an electrode. Preferably, the second material comprises silver. Other materials include gold, platinum, palladium, tungsten or chromium. Whilst step 140 is shown as a single step, it may comprise multiple steps. For example, in a preferred embodiment, a layer of silver is first deposited. Then, a layer of an insulator material, as disclosed in WO04049379, such as $C_3N_4$ or $Al_4Si_3$ may be formed on the layer of silver. The scope of the invention is not limited to the use of these materials, and the use of other materials commonly employed in wafer applications are encompassed within the present invention.

In a fifth step 150, the first substrate and the one or more layers deposited thereon, and the second substrate and the one or more layers deposited thereon are pressed together with sufficient force that surface features on material 122 are 'matched' on surface material 142, and surface features on material 142 are 'matched' on surface material 122. Substrates may be pressed together by means of cold pressing, as known in the art, wherein pressure is applied by means of a piston at temperatures below the melting point of the electrode materials. Substrates may also be pressed together by the application of cold isostatic pressure, as known in the art. Typical pressures employed in this process differ depending on the specific materials used but are of the order of 10-120 GPa. The duration for which the substrates are pressed together is in the order of a few minutes and the temperature typically not much above ambient temperature, i.e. about 25 degree C.

During the pressing process, material displaced is able to squeezed into the network of channels. Without the network of channels, the surface replication step will not work, as there is nowhere for displaced material to be squeezed.

Depending on the nature of the layers deposited on the two substrates, the two substrates may need to be heated (to reduce the hardness of the layers) or cooled (to increase the hardness of the layers).

Preferably, all the steps above are performed in a substantially evacuated atmosphere.

In a sixth step 160, the composite is split between layers 122 and 142 to form two electrodes in which sur6ce features of one are reflected in the other; thus where layer 122 has a protruding feature, layer 142 has a matching indented feature, and vice versa. This relationship, of course, does not bold in the regions of the channels. The separation step may be achieved, for example and without limitation, by applying an electrical current through the materials to separate the electrodes along the boundary of two layers; by cooling or heating the materials, so that the differential in the Thermal Coefficient of Expansion (TCE) between two materials breaks the adhesive bond between the two materials; by forcible separation of the two materials to break the adhesion between the two materials, for example by means of piezoelectric actuators as known in the art; or by the addition or removal of energy, for example by means of an ultrasonic treatment step. A specific example is given below.

In a preferred embodiment the force with which the two substrates are pressed together in step 150 is sufficient that the two substrates and the one or more layers deposited thereupon form a single composite 152. According to this embodiment, during a sixth step 160, the temperature of the composite is altered such that the composite splits between layers 122 and 142 to form two electrodes in which surface features of one are reflected in the other; thus where layer 122 has a protruding feature, layer 142 has a matching indented feature, and vice versa. For example without limitation, a composite formed from the materials described above (Ag/AgO/AgCsO on substrate 102 and insulator/Ag on substrate 122) is cooled further, which causes the composite to split into two halves along the junction between the AgCsO layer and the insulator layer.

Thus two matching electrodes are formed, which may be utilized in devices requiring close-spaced electrodes, such as the tunnelling devices described in U.S. Pat. No. 6,720,704.

For example, and without limitation, first substrate 102 may comprise n-type doped silicon, with conductivity of the order of 0.05 Ohm cm. A 0.1.mu.m thick titanium film, comprising first material 122, is deposited over the silicon substrate using DC magnetron sputtering method. Second substrate 132 may comprise copper, coated with silver, corresponding to second material 142. A network of channels is formed on the surfaces of both the silicon and copper substrates by means of focused ion beam miliing, as known in the art. The titanium coated silicon substrate and silver coated copper substrate are then pressed together by way of cold pressing with applied pressure of 110 GPa. The composite formed thereby can be split by way of application of a current of the order of 0.1 snips/$cm^2$ and 0.1 V. Alternatively, piezoelectric actuators may be used to draw the electrodes apart. The composite may also be cooled to 0° C. or heated to 40° C., whereby the silver and titanium layers separate due to their different coefficients of thermal expansion.

Figure 2:
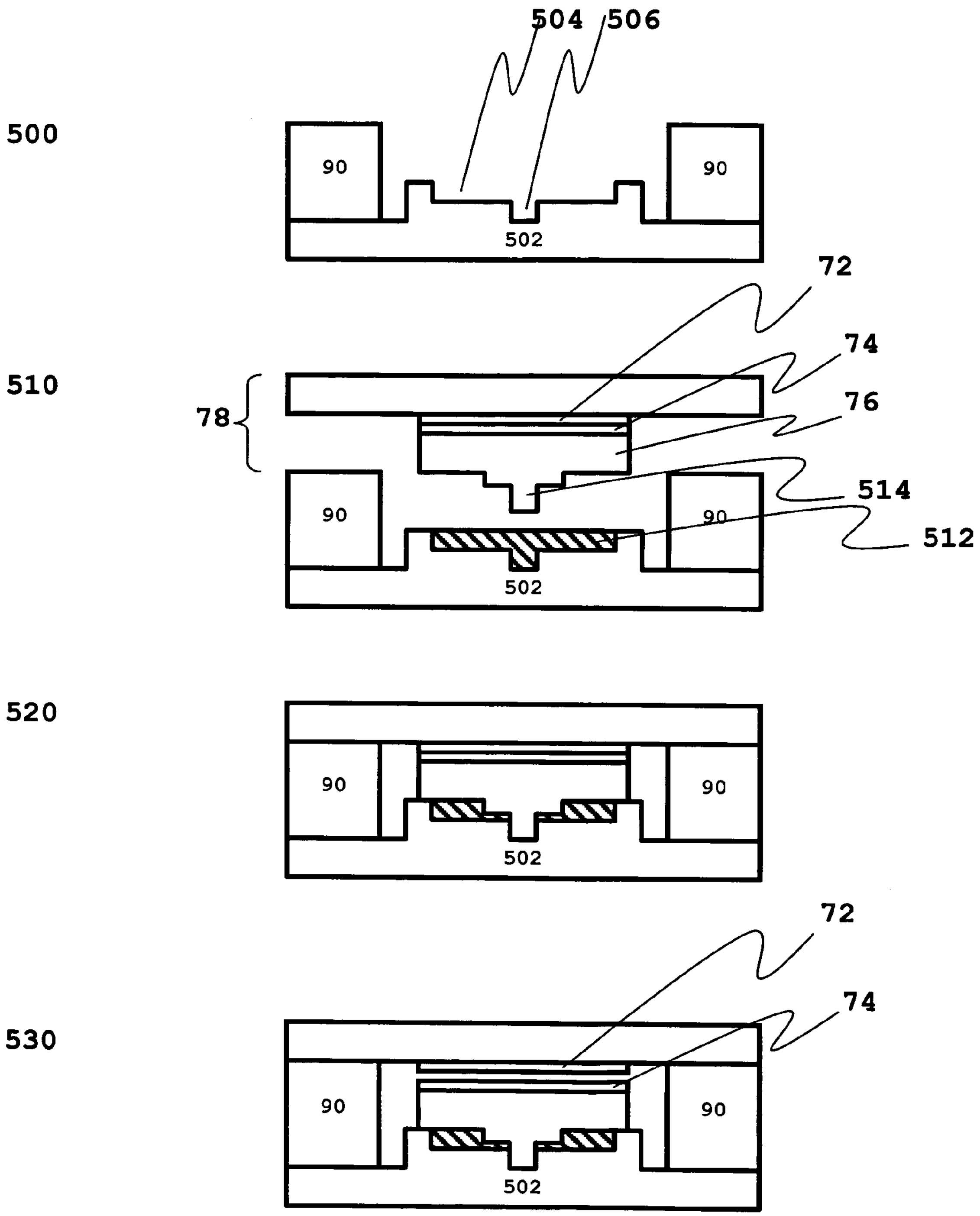
FIG. 2 is a schematic showing a process for the manufacture of a diode device having a tubular housing/actuator.

For example and without limitation, the composite may be housed in the device described in WO03090245, as shown in FIG. 2 and as disclosed below. Referring now to FIG. 2, composite 78 is composite 152 depicted in FIG. 1 having a further layer of copper 76 grown electrochemically by conventional processes on substrate 132. In step 500 a first substrate 502 is brought into contact with a polished end of a quartz tube 90. Substrate 502 is any material which may be bonded to quartz, and which has a similar thermal expansion coefficient to quartz. Preferably substrate 502 is molybdenum, or silicon doped to render at least a portion of it electrically conductive. Substrate 502 has a depression 504 across part of its surface. Substrate 502 also has a locating hole 506 in its surface. In step 510, liquid metal 512, is introduced into depression 502. The liquid metal is a metal having a high temperature of vaporization, and which is liquid under the conditions of operation of the device. The high temperature of vaporization ensures that the vapor from the liquid does not degrade the vacuum within the finished device. Preferably the liquid metal is a mixture of Indium and Gallium. Composite 78 is positioned so that alignment pin 514 is positioned above locating hole 506. Alignment pin 514, which is pre-machined, is placed on the composite near the end of the electrolytic growth phase; this results in its attachment to the layer of copper 76. The diameter of the alignment pin is the same as the diameter of the locating hole. In step 520, the polished silicon periphery of the composite 78 is contacted with the other polished end of the quartz tube 90; at the same time, the attachment pin seats in locating hole. During this step, substrate 502 is heated so that locating hole expands; when the assemblage is subsequently cooled, there is a tight fit between the alignment pin and the locating hole. High pressure is applied to this assemblage, which accelerates the chemical reaction between the polished silicon periphery of the composites and the polished ends of the quartz tube, bonding the polished surfaces to form the assemblage depicted in step 520. In step 530, the assemblage is heated, and a signal applied to the quartz tube to cause the composite to open as shown, forming two electrodes, 72 and 74. This is analogous to step 160 and the electrode composite opens as shown, forming a pair of matching electrodes, 72 and 74. During the opening process, the tight fit between the alignment pin and the locating hole ensures that the electrodes 72 and 74 do not slide relative to one another.

Other housing designs and integration approaches may be adopted, and the scope of the present invention is not limited by the housing and integration example disclosed above.

Although the above specification contains many specificities, these should not be construed as limiting the scope of the invention but as merely providing illustrations of some of the presently preferred embodiments of this invention.

Devices made according to the present invention may be used in diode devices, vacuum diode devices, heat pumps, any other devices that are based on tunneling effects, and the like.

While this invention has been described with reference to numerous embodiments, it is to be understood that this description is not intended to be construed in a limiting sense. Various modifications and combinations of the illustrative embodiments will be apparent to persons skilled in the art upon reference to this description. It is to be further understood, therefore, that numerous changes in the details of the embodiments of the present invention and additional embodiments of the present invention will be apparent to, and may be made by, persons of ordinary skill in the art having reference to this description. It is contemplated that all such changes and additional embodiments are within the spirit and true scope of the invention as claimed below.

All publications and patent applications mentioned in this specification are indicative of the level of skill of those skilled in the art to which this invention pertains. All publications and patent applications are herein incorporated by reference to the same extent as if each individual publication or patent application was specifically and individually indicated to be incorporated by reference.

The invention claimed is:

1. A process for making a matching pair of surfaces comprising the steps:

a) creating a network of channels on a surface of a first substrate;

b) coating a layer of a first material over said surface of said first substrate;

c) creating a network of channels on a surface of a second substrate;

d) coating a layer of a second material over said surface of said second substrate;

e) contacting said layer of a first material and said layer of a second material;

f) applying pressure across said layer of a first material and said layer of a second material; pressing said first material and said second material into said network of channels, thereby forming a composite; and, g) separating said composite whereby a matching pair of surfaces is formed, wherein where one surface has an indentation the other surface has a protrusion so that the two surfaces are substantially equidistant from each other.

2. The process of claim 1 wherein said step of creating a network of channels comprises photolithography.

3. The process of claim 1 wherein said step of creating a network of channels comprises ion beam milling.

4. The process of claim 1 wherein said step of coating a layer of a first material comprises multiple coating steps.

5. The process of claim 1 wherein said step of coating a layer of a first material comprises the steps:

a) depositing a layer of silver;

b) oxidising partially said layer of silver and forming a layer of silver oxide; and c) exposing said layer of silver oxide to caesium and forming a layer of caesiated silver oxide.

6. The process of claim 1 wherein said first material comprises more than one material.

7. The process of claim 1 wherein said step of coating a layer of a second material comprises multiple coating steps.

8. The process of claim 1 wherein said step of coating a layer of a second material comprises the steps:

a) depositing a layer of silver, and b) depositing a layer of an insulator on said layer of silver.

9. The process of claim 8 wherein said insulator material comprises a material selected from the group consisting of: aluminum oxide ($Al_2O_3$), carbon nitride ($C_3N_4$), and aluminum silicide ($Al_4Si_3$).

10. The process of claim 1 wherein said second material comprises more than one material.

11. The process of claim 1 wherein said network of channels is characterised by having a depth of approximately 100 nm and a spacing between the channels is approximately 500 μm.

12. The method of claim 1 wherein said step of separating said composite comprises applying an electric current between said first material and said second material.

13. The method of claim 1 wherein said step of separating said composite comprises heating said composite.

14. The method of claim 1 wherein said step of separating said composite comprises cooling said composite.

15. The method of claim 1 wherein said step of separating said composite comprises applying or removing energy to or from the composite.

16. The method of claim 1 wherein said step of separating said composite comprises applying a mechanical force.

17. A pair of matching electrodes made according to the method of claim 1.

* * * * *